(12) United States Patent
Li

(10) Patent No.: US 6,974,965 B2
(45) Date of Patent: Dec. 13, 2005

(54) AGGLOMERATION ELIMINATION FOR METAL SPUTTER DEPOSITION OF CHALCOGENIDES

(75) Inventor: Jiutao Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/758,008

(22) Filed: Jan. 16, 2004

(65) Prior Publication Data

US 2004/0144973 A1    Jul. 29, 2004

Related U.S. Application Data

(62) Division of application No. 09/809,331, filed on Mar. 15, 2001, now Pat. No. 6,734,455.

(51) Int. Cl.[7] .................. H01L 21/00; H01L 29/06; H01L 47/00; H01L 31/20; H01L 31/036
(52) U.S. Cl. .................. 257/2; 257/4; 257/35; 257/42; 438/95
(58) Field of Search .............................. 257/2; 438/95

(56) References Cited

U.S. PATENT DOCUMENTS

| | | |
|---|---|---|
| 3,271,591 A | 9/1966 | Ovshinsky |
| 3,622,319 A | 11/1971 | Sharp |
| 3,743,847 A | 7/1973 | Boland |
| 3,961,314 A | 6/1976 | Klose et al. |
| 3,966,317 A | 6/1976 | Wacks et al. |
| 3,983,542 A | 9/1976 | Ovshinsky |
| 3,988,720 A | 10/1976 | Ovshinsky |
| 4,177,474 A | 12/1979 | Ovshinsky |
| 4,267,261 A | 5/1981 | Hallman et al. |
| 4,269,935 A | 5/1981 | Masters et al. |
| 4,312,938 A | 1/1982 | Drexler et al. |
| 4,316,946 A | 2/1982 | Masters et al. |
| 4,320,191 A | 3/1982 | Yoshikawa et al. |
| 4,381,517 A | 4/1983 | Harada |
| 4,405,710 A | 9/1983 | Balasubramanyam et al. |
| 4,419,421 A | 12/1983 | Wichelhaus et al. |
| 4,499,557 A | 2/1985 | Holmberg et al. |
| 4,597,162 A | 7/1986 | Johnson et al. |
| 4,608,296 A | 8/1986 | Keem et al. |
| 4,637,895 A | 1/1987 | Ovshinsky et al. |

(Continued)

FOREIGN PATENT DOCUMENTS

JP    56126916    10/1981

(Continued)

OTHER PUBLICATIONS

Abdel-All, A.; Elshafie,A.; Elhawary, M.M., DC electric-field effect in bulk and thin-film Ge5As38Te57 chalcogenide glass, Vacuum 59 (2000) 845-853.

(Continued)

Primary Examiner—Tom Thomas
Assistant Examiner—Jesse A. Fenty
(74) Attorney, Agent, or Firm—Dickstein Shapiro Morin & Oshinsky LLP

(57) ABSTRACT

A method for fabricating chalcogenide materials on substrates, which reduces and/or eliminates agglomeration of materials on the chalcogenide materials; and system and devices for performing the method, semiconductor devices so produced, and machine readable media containing the method. One method disclosed includes forming a first layer, forming a second layer on the first layer, forming a third layer on the second layer, wherein the third layer is essentially transparent to irradiation, and irradiating the second layer through the third layer to cause the second layer to diffuse into the first layer thereby creating an integral layer of materials from the first and second layers.

11 Claims, 8 Drawing Sheets

U.S. PATENT DOCUMENTS

| | | | |
|---|---|---|---|
| 4,646,266 A | 2/1987 | Ovshinsky et al. | |
| 4,664,939 A | 5/1987 | Ovshinsky | |
| 4,668,968 A | 5/1987 | Ovshinsky et al. | |
| 4,670,763 A | 6/1987 | Ovshinsky et al. | |
| 4,671,618 A | 6/1987 | Wu et al. | |
| 4,673,957 A | 6/1987 | Ovshinsky et al. | |
| 4,678,679 A | 7/1987 | Ovshinsky | |
| 4,696,758 A | 9/1987 | Ovshinsky et al. | |
| 4,698,234 A | 10/1987 | Ovshinsky et al. | |
| 4,710,899 A | 12/1987 | Young et al. | |
| 4,728,406 A | 3/1988 | Banerjee et al. | |
| 4,737,379 A | 4/1988 | Hudgens et al. | |
| 4,766,471 A | 8/1988 | Ovshinsky et al. | |
| 4,769,338 A | 9/1988 | Ovshinsky et al. | |
| 4,775,425 A | 10/1988 | Guha et al. | |
| 4,788,594 A | 11/1988 | Ovshinsky et al. | |
| 4,795,657 A | 1/1989 | Formigoni et al. | |
| 4,800,526 A | 1/1989 | Lewis | |
| 4,804,490 A | 2/1989 | Pryor et al. | |
| 4,809,044 A | 2/1989 | Pryor et al. | |
| 4,818,717 A | 4/1989 | Johnson et al. | |
| 4,843,443 A | 6/1989 | Ovshinsky et al. | |
| 4,845,533 A | 7/1989 | Pryor et al. | |
| 4,847,674 A | 7/1989 | Sliwa et al. | |
| 4,853,785 A | 8/1989 | Ovshinsky et al. | |
| 4,891,330 A | 1/1990 | Guha et al. | |
| 4,920,078 A | 4/1990 | Bagley et al. | |
| 5,128,099 A | 7/1992 | Strand et al. | |
| 5,159,661 A | 10/1992 | Ovshinsky et al. | |
| 5,166,758 A | 11/1992 | Ovshinsky et al. | |
| 5,177,567 A | 1/1993 | Klersy et al. | |
| 5,219,788 A | 6/1993 | Abernathey et al. | |
| 5,238,862 A | 8/1993 | Blalock et al. | |
| 5,272,359 A | 12/1993 | Nagasubramanian et al. | |
| 5,296,716 A | 3/1994 | Ovshinsky et al. | |
| 5,314,772 A | 5/1994 | Kozicki | |
| 5,315,131 A | 5/1994 | Kishimoto et al. | |
| 5,330,630 A | 7/1994 | Klersy et al. | |
| 5,335,219 A | 8/1994 | Ovshinsky et al. | |
| 5,341,328 A | 8/1994 | Ovshinsky et al. | |
| 5,350,484 A | 9/1994 | Gardner et al. | |
| 5,359,205 A | 10/1994 | Ovshinsky | |
| 5,360,981 A | 11/1994 | Owen et al. | |
| 5,363,329 A | 11/1994 | Troyan | |
| 5,406,509 A | 4/1995 | Ovshinsky et al. | |
| 5,414,271 A | 5/1995 | Ovshinsky et al. | |
| 5,500,532 A | 3/1996 | Kozicki et al. | |
| 5,512,328 A | 4/1996 | Yoshimura et al. | |
| 5,512,773 A | 4/1996 | Wolf et al. | |
| 5,534,711 A | 7/1996 | Ovshinsky et al. | |
| 5,534,712 A | 7/1996 | Ovshinsky et al. | |
| 5,536,947 A | 7/1996 | Klersy et al. | |
| 5,543,737 A | 8/1996 | Ovshinsky | |
| 5,591,501 A | 1/1997 | Ovshinsky et al. | |
| 5,596,522 A | 1/1997 | Ovshinsky et al. | |
| 5,687,112 A | 11/1997 | Ovshinsky | |
| 5,694,054 A | 12/1997 | Ovshinsky et al. | |
| 5,714,768 A | 2/1998 | Ovshinsky et al. | |
| 5,726,083 A | 3/1998 | Takaishi | |
| 5,751,012 A | 5/1998 | Wolstenholme et al. | |
| 5,761,115 A | 6/1998 | Kozicki et al. | |
| 5,789,277 A | 8/1998 | Zahorik et al. | |
| 5,814,527 A | 9/1998 | Wolstenholme et al. | |
| 5,818,749 A | 10/1998 | Harshfield | |
| 5,825,046 A | 10/1998 | Czubatyj et al. | |
| 5,837,564 A | 11/1998 | Sandhu et al. | |
| 5,841,150 A | 11/1998 | Gonzalez et al. | |
| 5,846,889 A | 12/1998 | Harbison et al. | |
| 5,851,882 A | 12/1998 | Harshfield | |
| 5,869,843 A | 2/1999 | Harshfield | |
| 5,896,312 A | 4/1999 | Kozicki et al. | |
| 5,912,839 A | 6/1999 | Ovshinsky et al. | |
| 5,914,893 A | 6/1999 | Kozicki et al. | |
| 5,920,788 A | 7/1999 | Reinberg | |
| 5,933,365 A | 8/1999 | Klersy et al. | |
| 5,998,066 A | 12/1999 | Block et al. | |
| 6,011,757 A | 1/2000 | Ovshinsky | |
| 6,031,287 A | 2/2000 | Harshfield | |
| 6,072,716 A | 6/2000 | Jacobson et al. | |
| 6,077,729 A | 6/2000 | Harshfield | |
| 6,084,796 A | 7/2000 | Kozicki et al. | |
| 6,087,674 A | 7/2000 | Ovshinsky et al. | |
| 6,117,720 A | 9/2000 | Harshfield | |
| 6,141,241 A | 10/2000 | Ovshinsky et al. | |
| 6,143,604 A | 11/2000 | Chiang et al. | |
| 6,177,338 B1 | 1/2001 | Liaw et al. | |
| 6,473,332 B1 | 4/2001 | Ignatiev et al. | |
| 6,236,059 B1 | 5/2001 | Wolsteinholme et al. | |
| RE37,259 E | 7/2001 | Ovshinsky | |
| 6,297,170 B1 | 10/2001 | Gabriel et al. | |
| 6,300,684 B1 | 10/2001 | Gonzalez et al. | |
| 6,316,784 B1 | 11/2001 | Zahorik et al. | |
| 6,329,606 B1 | 12/2001 | Freyman et al. | |
| 6,339,544 B1 | 1/2002 | Chiang et al. | |
| 6,348,365 B1 * | 2/2002 | Moore et al. | 438/130 |
| 6,350,679 B1 | 2/2002 | McDaniel et al. | |
| 6,376,284 B1 | 4/2002 | Gonzalez et al. | |
| 6,388,324 B2 | 5/2002 | Kozicki et al. | |
| 6,391,688 B1 | 5/2002 | Gonzalez et al. | |
| 6,404,665 B1 | 6/2002 | Lowery et al. | |
| 6,414,376 B1 | 7/2002 | Thakur et al. | |
| 6,418,049 B1 | 7/2002 | Kozicki et al. | |
| 6,420,260 B1 | 7/2002 | Ngan et al. | |
| 6,420,725 B1 | 7/2002 | Harshfield | |
| 6,423,621 B2 * | 7/2002 | Doan et al. | 438/597 |
| 6,423,628 B1 | 7/2002 | Li et al. | |
| 6,429,064 B1 | 8/2002 | Wicker | |
| 6,429,127 B1 | 8/2002 | Derderian et al. | |
| 6,437,383 B1 | 8/2002 | Xu | |
| 6,440,837 B1 | 8/2002 | Harshfield | |
| 6,462,984 B1 | 10/2002 | Xu et al. | |
| 6,469,364 B1 | 10/2002 | Kozicki | |
| 6,480,438 B1 | 11/2002 | Park | |
| 6,487,106 B1 | 11/2002 | Kozicki | |
| 6,487,113 B1 | 11/2002 | Park et al. | |
| 6,501,111 B1 | 12/2002 | Lowery | |
| 6,507,061 B1 | 1/2003 | Hudgens et al. | |
| 6,511,862 B2 | 1/2003 | Hudgens et al. | |
| 6,511,867 B2 | 1/2003 | Lowery et al. | |
| 6,512,241 B1 | 1/2003 | Lai | |
| 6,514,805 B2 | 2/2003 | Xu et al. | |
| 6,531,373 B2 | 3/2003 | Gill et al. | |
| 6,534,781 B2 | 3/2003 | Dennison | |
| 6,545,287 B2 | 4/2003 | Chiang | |
| 6,545,907 B1 | 4/2003 | Lowery et al. | |
| 6,563,164 B2 | 5/2003 | Lowery et al. | |
| 6,566,700 B2 | 5/2003 | Xu | |
| 6,567,293 B1 | 5/2003 | Lowery et al. | |
| 6,569,705 B2 | 5/2003 | Chiang et al. | |
| 6,570,784 B2 | 5/2003 | Lowery | |
| 6,576,921 B2 | 6/2003 | Lowery | |
| 6,586,761 B2 | 7/2003 | Lowery | |
| 6,589,714 B2 | 7/2003 | Maimon et al. | |
| 6,590,807 B2 | 7/2003 | Lowery | |
| 6,593,176 B2 | 7/2003 | Dennison | |
| 6,597,009 B2 | 7/2003 | Wicker | |
| 6,605,527 B2 | 8/2003 | Dennison et al. | |
| 6,613,604 B2 | 9/2003 | Maimon et al. | |
| 6,621,095 B2 | 9/2003 | Chiang et al. | |
| 6,625,054 B2 | 9/2003 | Lowery et al. | |
| 6,642,102 B2 | 11/2003 | Xu | |
| 6,646,297 B2 | 11/2003 | Dennison | |
| 6,649,928 B2 | 11/2003 | Dennison | |
| 6,667,900 B2 | 12/2003 | Lowery et al. | |

| | | |
|---|---|---|
| 6,671,710 B2 | 12/2003 | Ovshinsky et al. |
| 6,673,700 B2 | 1/2004 | Dennison et al. |
| 6,674,115 B2 | 1/2004 | Hudgens et al. |
| 6,687,153 B2 | 2/2004 | Lowery |
| 6,687,427 B2 | 2/2004 | Ramalingam et al. |
| 6,690,026 B2 | 2/2004 | Peterson |
| 6,696,355 B2 | 2/2004 | Dennison |
| 6,707,712 B2 | 3/2004 | Lowery |
| 6,714,954 B2 | 3/2004 | Ovshinsky et al. |
| 6,734,455 B2 * | 5/2004 | Li .............................. 257/35 |
| 2002/0000666 A1 | 1/2002 | Kozicki et al. |
| 2002/0072188 A1 | 6/2002 | Gilton |
| 2002/0106849 A1 | 8/2002 | Moore |
| 2002/0123169 A1 | 9/2002 | Moore et al. |
| 2002/0123170 A1 | 9/2002 | Moore et al. |
| 2002/0123248 A1 | 9/2002 | Moore et al. |
| 2002/0127886 A1 * | 9/2002 | Moore et al. ............... 438/800 |
| 2002/0132417 A1 | 9/2002 | Li |
| 2002/0160551 A1 | 10/2002 | Harshfield |
| 2002/0163828 A1 | 11/2002 | Krieger et al. |
| 2002/0168820 A1 | 11/2002 | Kozicki et al. |
| 2002/0168852 A1 | 11/2002 | Harshfield et al. |
| 2002/0190289 A1 | 12/2002 | Harshfield et al. |
| 2002/0190350 A1 | 12/2002 | Kozicki |
| 2003/0001229 A1 | 1/2003 | Moore et al. |
| 2003/0027416 A1 | 2/2003 | Moore |
| 2003/0032254 A1 | 2/2003 | Gilton |
| 2003/0035314 A1 | 2/2003 | Kozicki |
| 2003/0035315 A1 | 2/2003 | Kozicki |
| 2003/0038301 A1 | 2/2003 | Moore |
| 2003/0043631 A1 | 3/2003 | Gilton et al. |
| 2003/0045049 A1 | 3/2003 | Campbell et al. |
| 2003/0045054 A1 | 3/2003 | Campbell et al. |
| 2003/0047765 A1 | 3/2003 | Campbell |
| 2003/0047772 A1 | 3/2003 | Li |
| 2003/0047773 A1 | 3/2003 | Li |
| 2003/0048519 A1 | 3/2003 | Kozicki |
| 2003/0048744 A1 | 3/2003 | Ovshinsky et al. |
| 2003/0049912 A1 | 3/2003 | Campbell et al. |
| 2003/0068861 A1 | 4/2003 | Li |
| 2003/0068862 A1 | 4/2003 | Li |
| 2003/0095426 A1 | 5/2003 | Hush et al. |
| 2003/0096497 A1 | 5/2003 | Moore et al. |
| 2003/0107105 A1 | 6/2003 | Kozicki |
| 2003/0117831 A1 | 6/2003 | Hush |
| 2003/0128612 A1 | 7/2003 | Moore et al. |
| 2003/0137869 A1 | 7/2003 | Kozicki |
| 2003/0143782 A1 | 7/2003 | Gilton et al. |
| 2003/0155589 A1 | 8/2003 | Campbell et al. |
| 2003/0155606 A1 | 8/2003 | Campbell et al. |
| 2003/0156447 A1 | 8/2003 | Kozicki |
| 2003/0156463 A1 | 8/2003 | Casper et al. |
| 2003/0209728 A1 | 11/2003 | Kozicki et al. |
| 2003/0209971 A1 | 11/2003 | Kozicki et al. |
| 2003/0210564 A1 | 11/2003 | Kozicki et al. |
| 2003/0212724 A1 | 11/2003 | Ovshinsky et al. |
| 2003/0212725 A1 | 11/2003 | Ovshinsky et al. |
| 2004/0035401 A1 | 2/2004 | Ramachandran et al. |

FOREIGN PATENT DOCUMENTS

| | | |
|---|---|---|
| WO | WO 97/48032 | 12/1997 |
| WO | WO 99/28914 | 6/1999 |
| WO | WO 00/48196 | 8/2000 |
| WO | WO 02/21542 | 3/2002 |

OTHER PUBLICATIONS

Adler, D.; Moss, S.C., Amorphous memories and bistable switches, J. Vac. Sci. Technol. 9 (1972) 1182-1189.
Adler, D.; Henisch, H.K.; Mott, S.N., The mechanism of threshold switching in amorphous alloys, Rev. Mod. Phys. 50 (1978) 209-220.
Afifi, M.A.; Labib, H.H.; El-Fazary, M.H.; Fadel, M., Electrical and thermal properties of chalcogenide glass system Se75Ge25-xSbx, Appl. Phys. A 55 (1992) 167-169.
Afifi,M.A.; Labib, H.H.; Fouad, S.S.; El-Shazly, A.A., Electrical & thermal conductivity of the amorphous semiconductor GexSe1-x, Egypt, J. Phys. 17 (1986) 335-342.
Alekperova, Sh.M.; Gadzhieva, G.S., Current-Voltage characteristics of Ag2Se single crystal near the phase transition, Inorganic Materials 23 (1987) 137-139.
Aleksiejunas, A.; Cesnys, A., Switching phenomenon and memory effect in thin-film heterojunction of polycrystalline selenium-silver selenide, Phys. Stat. Sol. (a) 19 (1973) K169-K171.
Angell, C.A., Mobile ions in amorphous solids, Annu. Rev. Phys. Chem. 43 (1992) 693-717.
Aniya, M., Average electronegativity, medium-range-order, and ionic conductivity in superionic glasses, Solid state Ionics 136-137 (2000) 1085-1089.
Asahara, Y.; Izumitani, T., Voltage controlled switching in Cu-As-Se compositions, J. Non-Cryst. Solids 11 (1972) 97-104.
Asokan, S.; Prasad, M.V.N.; Parthasarathy, G.; Gopal, E.S.R., Mechanical and chemical thresholds in IV-VI chalcogenide glasses, Phys. Rev. Lett. 62 (1989) 808-810.
Baranovskii, S.D.; Cordes, H., On the conduction mechanism in ionic glasses, J. Chem. Phys. 111 (1999) 7546-7557.
Belin, R.; Taillades, G.; Pradel, A.; Ribes, M., Ion dynamics in superionic chalcogenide glasses: complete conductivity spectra, Solid state Ionics 136-137 (2000) 1025-1029.
Belin, R.; Zerouale, A.; Pradel, A.; Ribes, M., Ion dynamics in the argyrodite compound Ag7GeSe5l: non-Arrhenius behavior and complete conductivity spectra, Solid State Ionics 143 (2001) 445-455.
Benmore, C.J.; Salmon, P.S., Structure of fast ion conducting and semiconducting glassy chalcogenide alloys, Phys. Rev. Lett. 73 (1994) 264-267.
Bernede, J.C., Influence du metal des electrodes sur les caracleristiques.courant-tension des structures M-Ag2Se-M, Thin solid films 70 (1980) L1-L4.
Bernede, J.C., Polarized memory switching in MIS thin films, Thin Solid Films 81 (1981) 155-160.
Bernede, J.C., Switching and silver movements in Ag2Se thin films, Phys. Stat. Sol. (a) 57 (1980) K101-K104.
Bernede, J.C.; Abachi, T., Differential negative resistance in metal/insulator/metal structures with an upper bilayer electrode, Thin solid films 131 (1985) L61-L64.
Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 165-171.
Bernede, J.C., Khelil, A.; Kettaf, M.; Conan, A., Transition from S- to N-type differential negative resistance in Al-Al2O3-Ag2-xSe1+x thin film structures, Phys. Stat. Sol. (a) 74 (1982) 217-224.
Bondarev, V.N.; Pikhitsa, P.V., A dendrite model of current Instability in RbAg4l5, Solid State Ionics 70/71 (1994) 72-76.
Boolchand, P., The maximum in glass transition temperature (Tg) near x=1/3 in GexSe1-x Glasses, Asian Journal of Physics (2000) 9, 709-72.
Boolchand, P.; Bresser, W.J., Mobile silver ions and glass formation in solid electrolytes, Nature 410 (2001) 1070-1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97-132.

Boolchand, P.; Enzweiler, R.N.; Tenhover, M., Structural ordering of evaporated amorphous chalcogenide alloy films: role of thermal annealing, Diffusion and Defect Data vol. 53-54 (1987) 415-420.

Boolchand, P.; Grothaus, J.; Bresser, W.J.; Suranyi, P., Structural origin of broken chemical order in a $GeSe_2$ glass, Phys. Rev. B 25 (1982) 2975-2978.

Boolchand, P.; Grothaus, J.; Phillips, J.C., Broken chemical order and phase separation in $Ge_xSe_{1-x}$ glasses, Solid state comm. 45 (1983) 183-185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221-0030.

Boolchand, P.; Grothaus, J, Molecular Structure of Melt-Quenched $GeSe_2$ and $GeS_2$ glasses compared, Proc. Int. Conf. Phys. Semicond. (Eds. Chadi and Harrison) $17^{th}$ (1985) 833-36.

Bresser, W.; Boolchand, P.; Suranyi, P., Rigidity percolation and molecular clustering in network glasses, Phys. Rev. Lett. 56 (1986) 2493-2496.

Bresser, W.J.; Boolchand, P.; Suranyi, P.; de Neufville, J.P, Intrinsically broken chalcogen chemical order in stoichiometric glasses, Journal de Physique 42 (1981) C4-193-C4-196.

Bresser, W.J.; Boolchand, P.; Suranyi, P.; Hernandez, J.G., Molecular phase separation and cluster size in $GeSe_2$ glass, Hyperfine Interactions 27 (1986) 389-392.

Cahen, D.; Gilet, J.-M.; Schmitz, C.; Chernyak, L.; Gartsman, K.; Jakubowicz, A., Room-Temperature, electric field induced creation of stable devices in $CuInSe_2$ Crystals, Science 258 (1992) 271-274.

Chatterjee, R.; Asokan, S.; Titus, S.S.K., Current-controlled negative-resistance behavior and memory switching in bulk As-Te-Se glasses, J. Phys. D: Appl. Phys. 27 (1994) 2624-2627.

Chen, C.H.; Tai, K.L. , Whisker growth induced by Ag photodoping in glassy $Ge_xSe_{1-x}$ films, Appl. Phys. Lett. 37 (1980) 1075-1077.

Chen, G.; Cheng, J., Role of nitrogen in the crystallization of silicon nitride-doped chalcogenide glasses, J. Am. Ceram. Soc. 82 (1999) 2934-2936.

Chen, G.; Cheng, J.; Chen, W., Effect of $Si_3N_4$ on chemical durability of chalcogenide glass, J. Non-Cryst. Solids 220 (1997) 249-253.

Cohen, M.H.; Neale, R.G.; Paskin, A., A model for an amorphous semiconductor memory device, J. Non-Cryst. Solids 8-10 (1972) 885-891.

Croitoru, N.; Lazarescu, M.; Popescu, C.; Telnic, M.; and Vescan, L., Ohmic and non-ohmic conduction in some amorphous semiconductors, J. Non-Cryst. Solids 8-10 (1972) 781-786.

Dalven, R.; Gill, R., Electrical properties of beta-$Ag_2Te$ and beta-$Ag_2Se$ from 4.2 to 300K, J. Appl. Phys. 38 (1967) 753-756.

Davis, E.A., Semiconductors without form, Search 1 (1970) 152-155.

Dearnaley, G.; Stoneham, A.M.; Morgan, D.V., Electrical phenomena in amorphous oxide films, Rep. Prog. Phys. 33 (1970) 1129-1191.

Dejus, R.J.; Susman, S.; Volin, K.J.; Montague, D.G.; Price, D.L., Structure of Vitreous Ag-Ge-Se, J. Non-Cryst. Solids 143 (1992) 162-180.

den Boer, W., Threshold switching in hydrogenated amorphous silicon, Appl. Phys. Lett. 40 (1982) 812-813.

Drusedau, T.P.; Panckow, A.N.; Klabunde, F., The hydrogenated amorphous silicon/nanodisperse metal (SIMAL) system-Films of unique electronic properties, J. Non-Cryst. Solids 198-200 (1996) 829-832.

El Bouchairi, B.; Bernede, J.C.; Burgaud, P., Properties of $Ag_{2-x}Se_{1+x}/n$-Si diodes, Thin Solid Films 110 (1983) 107-113.

El Gharras, Z.; Bourahla, A.; Vautier, C., Role of photoinduced defects in amorphous $Ge_xSe_{1-x}$ phootoconductivity, J. Non-Cryst. Solids 155 (1993) 171-179.

El Ghrandi, R.; Calas, J.; Galibert, G.; Averous, M., Silver photodissolution in amorphous chalcogenide thin films, Thin Solid Films 218 (1992)259-273.

El Ghrandi, R.; Calas, J.; Galibert, G., Ag dissolution kinetics in amorphous $GeSe_{5.5}$ thin films from "in-situ" resistance measurements vs time, Phys. Stat. Sol. (a) 123 (1991) 451-460.

El-kady, Y.L., The threshold switching in semiconducting glass $Ge_{21}Se_{17}Te_{62}$, Indian J. Phys. 70A (1996) 507-516.

Elliott, S.R., A unified mechanism for metal photodissolution in amorphous chalcogenide materials, J. Non-Cryst. Solids 130 (1991) 85-97.

Elliott, S.R., Photodissolution of metals in chalcogenide glasses: A unified mechanism, J. Non-Cryst. Solids 137-138 (1991) 1031-1034.

Elsamanoudy, M.M.; Hegab, N.A.; Fadel, M., Conduction mechanism in the pre-switching state of thin films containing Te As Ge Si, Vacuum 46 (1995) 701-707.

El-Zahed, H.; El-Korashy, A., Influence of composition on the electrical and optical properties of $Ge_{20}Bi_xSe_{80-x}$ films, Thin Solid Films 376 (2000) 236-240.

Fadel, M., Switching phenomenon in evaporated Se-Ge-As thin films of amorphous chalcogenide glass, Vacuum 44 (1993) 851-855.

Fadel, M.; El-Shair, H.T., Electrical, thermal and optical properties of $Se_{75}Ge_7Sb_{18}$, Vacuum 43 (1992) 253-257.

Feng, X. ;Bresser, W.J.; Boolchand, P., Direct evidence for stiffness threshold in Chalcogenide glasses, Phys. Rev. Lett. 78 (1997) 4422-4425.

Feng, X.; Bresser, W.J.; Zhang, M.; Goodman, B.; Boolchand, P., Role of network connectivity on the elastic, plastic and thermal behavior of covalent glasses, J. Non-Cryst. Solids 222 (1997) 137-143.

Fischer-Colbrie, A.; Bienenstock, A.; Fuoss, P.H.; Marcus, M.A., Structure and bonding in photodiffused amorphous $Ag-GeSe_2$ thin films, Phys. Rev. B 38 (1988) 12388-12403.

Fleury, G.; Hamou, A.; Viger, C.; Vautier, C., Conductivity and crystallization of amorphous selenium, Phys. Stat. Sol. (a) 64 (1981) 311-316.

Fritzsche, H, Optical and electrical energy gaps in amorphous semiconductors, J. Non-Cryst. Solids 6 (1971) 49-71.

Fritzsche, H., Electronic phenomena in amrophous semiconductors, Annual Review of Materials Science 2 (1972) 697-744.

Gates, B.; Wu, Y.; Yin, Y.; Yang, P.; Xia, Y., Single-crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013-1018.

Guin, J.-P.; Rouxel, T.; Keryvin, V.; Sangleboeuf, J.-C.; Serre, I.; Lucas, J., Indentation creep of Ge-Se chalcogenide glasses below Tg: elastic recovery and non-Newtonian flow, J. Non-Cryst. Solids 298 (2002) 260-269.

Guin, J.-P.; Rouxel, T.; Sangleboeuf, J.-C; Melscoet, I.; Lucus, J., Hardness, toughness, and scratchability of germanium-selenium chalcogenide glasses, J. Am. Ceram. Soc. 85 (2002) 1545-52.

Gupta, Y.P., On electrical switching and memory effects in amorphous chalcogenides, J. Non-Cryst. Sol. 3 (1970) 148-154.

Haberland, D.R.; Stiegler, H., New experiments on the charge-controlled switching effect in amorphous semiconductors, J. Non-Cryst. Solids 8-10 (1972) 408-414.

Haifz, M.M.; Ibrahim, M.M.; Dongol, M.; Hammad, F.H., Effect of composition on the structure and electrical properties of As-Se-Cu glasses, J. Apply. Phys. 54 (1983) 1950-1954.

Hajto, J.; Rose, M.J.; Osborne, I.S.; Snell, A.J.; Le Comber, P.G.; Owen, A.E., Quantization effects in metal/a-Si:H/metal devices, Int. J. Electronics 73 (1992) 911-913.

Hajto, J.; Hu, J.; Snell, A.J.; Turvey, K.; Rose, M., DC and AC measurements on metal/a-Si:H/metal room temperature quantised resistance devices, J. Non-Cryst. Solids 266-269 (2000) 1058-1061.

Hajto, J.; McAuley, B.; Snell, A.J.; Owen, A.E., Theory of room temperature quantized resistance effects in metal-a-Si:H-metal thin film structures, J. Non-Cryst. Solids 198-200 (1996) 825-828.

Hajto, J.; Owen, A.E.; Snell, A.J.; Le Comber, P.G.; Rose, M.J., Analogue memory and ballistic electron effects in metal-amorphous silicon structures, Phil. Mag. B 63 (1991) 349-369.

Hayashi, T.; Ono, Y.; Fukaya, M.; Kan, H., Polarized memory switching in amorphous Se film, Japan, J. Appl. Phys. 13 (1974) 1163-1164.

Hegab, N.A.; Fadel, M.; Sedeek, K., Memory switching phenomena in thin films of chalcogenide semiconductors, Vacuum 45 (1994) 459-462.

Hong, K.S.; Speyer, R.F., Switching behavior in II-IV-V2 amorphous semiconductor systems, J. Non-Cryst. Solids 116 (1990) 191-200.

Hosokawa, S., Atomic and electronic structures of glassy GexSe1-x around the stiffness threshold composition, J. Optoelectronics and Advanced Materials 3 (2001) 199-214.

Hu, J.; Snell, A.J.; Hajto, J.; Owen, A.E., Constant current forming in Cr/p+a-/Si:H/V thin film devices, J. Non-Cryst. Solids 227-230 (1998) 1187-1191.

Hu, J.; Hajto, J.; Snell, A.J.; Owen, A.E.; Rose, M.J., Capacitance anomaly near the metal-non-metal transition in Cr-hydrogenated amorphous Si-V thin-film devices, Phil. Mag. B. 74 (1996) 37-50.

Hu, J.; Snell, A.J.; Hajto, J.; Owen, A.E., Current-induced instability in Cr-p+a-Si:H-V thin film devices, Phil. Mag. B 80 (2000) 29-43.

Iizima, S.; Sugi, M.; Kikuchi, M.; Tanaka, K., Electrical and thermal properties of semiconducting glasses As-Te-Ge, Solid State Comm. 8 (1970) 153-155.

Ishikawa, R.; Kikuchi, M., Photovoltaic study on the photo-enhanced diffusion of Ag in amorphous films of Ge2S3, J. Non-Cryst. Solids 35 & 36 (1980) 1061-1066.

Iyetomi, H.; Vashishta, P.; Kalia, R.K., Incipient phase separation in Ag/Ge/Se glasses: clustering of Ag atoms, J. Non-Cryst. Solids 262 (2000) 135-142.

Jones, G.; Collins, R.A., Switching properties of thin selenium films under pulsed bias, Thin Solid Films 40 (1977) L15-L18.

Joullie, A.M.; Marucchi, J., On the DC electrical conduction of amorphous As2Se7 before switching, Phys. Stat. Sol. (a) 13 (1972) K105-K109.

Joullie, A.M.; Marucchi, J., Electrical properties of the amorphous alloy As2Se5, Mat. Res. Bull. 8 (1973) 433-442.

Kaplan, T.; Adler, D., Electrothermal switching in amorphous semiconductors, J. Non-Cryst. Solids 8-10 (1972) 538-543.

Kawaguchi, T.; Maruno, S.; Elliott, S.R., Optical, electrical, and structural properties of amorphous Ag-Ge-S and Ag-Ge-Se films and comparison of photoinduced and thermally induced phenomena of both systems, J. Appl. Phys. 79 (1996) 9096-9104.

Kawaguchi, T.; Masui, K., Analysis of change in optical transmission spectra resulting from Ag photodoping in chalcogenide film, Japn. J. Appl. Phys. 26 (1987) 15-21.

Kawasaki, M.; Kawamura, J.; Nakamura, Y.; Aniya, M., Ionic conductivity of Agx(GeSe3)1-x(0<=x<=0.571) glasses, Solid state Ionics 123 (1999) 259-269.

Kluge, G.; Thomas, A.; Klabes, R.; Grotzschel, R., Silver photodiffusion in amorphous GexSe100-x, J. Non-Cryst. Solids 124 (1990) 186-193.

Kolobov, A.V., On the origin of p-type conductivity in amorphous chalcogenides, J. Non-Cryst. Solids 198-200 (1996) 728-731.

Kolobov, A.V., Lateral diffusion of silver in vitreous chalcogenide films, J. Non-Cryst. Solids 137-138 (1991) 1027-1030.

Korkinova, Ts.N.; Andreichin,R.E., Chalcogenide glass polarization and the type of contacts, J. Non-Cryst. Solids 194 (1996) 256-259.

Kotkata, M.F.; Afif, M.A.; Labib, H.H.; Hegab, N.A.; Abdel-Aziz, M.M:, Memory switching in amorphous GeSeTl chalcogenide semiconductor films, Thin Solid Films 240 (1994) 143-146.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16-19.

Lal, M.; Goyal, N., Chemical bond approach to study the memory and threshold switching chalcogenide glasses, Indian Journal of pure & appl. phys. 29 (1991) 303-304.

Leimer, F.; Stotzel, H.; Kottwitz, A., Isothermal electrical polarisation of amorphous GeSe films with blocking Al contacts influenced by Poole-Frenkel conduction, Phys. Stat. Sol. (a) 29 (1975) K129-K132.

Leung, W.; Cheung, N.; Neureuther, A.R., Photoinduced diffusion of Ag in GexSe1-x glass, Appl. Phys. Lett. 46 (1985) 543-545.

Matsushita, T.; Yamagami, T.; Okuda, M., Polarized memory effect observed on Se-SnO2 system, Jap. J. Appl. Phys. 11 (1972) 1657-1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L, Reversible and irreversible electrical switching in TeO2-V2O5 based glasses, Journal de Physique IV 2 (1992) C2-185-C2-188.

Messoussi, R.; Bernede, J.C.; Benhida, S.; Abachi, T.; Latef, A., Electrical characterization of M/Se structures (M=Ni, Bi), Mat. Chem. And Phys. 28 (1991) 253-258.

Mitkova, M.; Boolchand, P., Microscopic origin of the glass forming tendency in chalcogenides and constraint theory, J. Non-Cryst. Solids 240 (1998) 1-21.

Mitkova, M.; Kozicki, M.N., Silver incorporation in Ge-Se glasses used in programmable metallization cell devices, J. Non-Cryst. Solids 299-302 (2002) 1023-1027.

Mitkova, M.; Wang, Y.; Boolchand, P., Dual chemical role of Ag as an additive in chalcogenide glasses, Phys. Rev. Lett. 83 (1999) 3848-3851.

Miyatani, S.-y., Electronic and ionic conduction in (AgxCu1-x)2Se, J. Phys. Soc. Japan 34 (1973) 423-432.

Miyatani, S.-y., Electrical properties of Ag2Se, J. Phys. Soc. Japan 13 (1958) 317.

Miyatani, S.-y., Ionic conduction in beta-Ag2Te and beta-Ag2Se, Journal Phys. Soc. Japan 14 (1959) 996-1002.

Mott, N.F., Conduction in glasses containing transition metal ions, J. Non-Cryst. Solids 1 (1968) 1-17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564-569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157-6161.

Nang, T.T.; Okuda, M.; Matsushita, T.; Yokota, S.; Susuki, A., Electrical and optical parameters of GexSe1-x amorphous thin films, Jap. J. App. Phys. 15 (1976) 849-853.

Narayanan, R.A.; Asokan, S.; Kumar, A., Evidence concerning the effect of topology on electrical switching in chalcogenide network glasses, Phys. Rev. B 54 (1996) 4413-4415.

Neale, R.G.; Aseltine, J.A., The application of amorphous materials to computer memories, IEEE transactions on electron dev. Ed-20 (1973) 195-209.

Ovshinsky S.R.; Fritzsche, H., Reversible strucrural transformations in amorphous semiconductors for memory and logic, Mettalurgical transactions 2 (1971) 641-645.

Ovshinsky, S.R., Reversible electrical switching phenomena in disordered structures, , Phys. Rev. Lett. 21 (1968) 1450-1453.

Owen, A.E.; LeComber, P.G.; Sarrabayrouse, G.; Spear, W.E., New amorphous-silicon electrically programmable nonvolatile switching device, IEE Proc. 129 (1982) 51-54.

Owen, A.E.; Firth, A.P.; Ewen, P.J.S., Photo-induced structural and physico-chemical changes in amorphous chalcogenide semiconductors, Phil. Mag. B 52 (1985) 347-362.

Owen, A.E.; Le Comber, P.G.; Hajto, J.; Rose, M.J.; Snell, A.J., Switching in amorphous devices, Int. J. Electronics 73 (1992) 897-906.

Pearson, A.D.; Miller, C.E., Filamentary conduction in semiconducting glass diodes, App. Phys. Lett. 14 (1969) 280-282.

Pinto, R.; Ramanathan, K.V., Electric field induced memory switching in thin films of the chalcogenide system Ge-As-Se, Appl. Phys. Lett. 19 (1971) 221-223.

Popescu, C., The effect of local non-uniformities on thermal switching and high field behavior of structures with chalcogenide glasses, Solid-state electronics 18 (1975) 671-681.

Popescu, C.; Croitoru, N., The contribution of the lateral thermal instability to the switching phenomenon, J. Non-Cryst. Solids 8-10 (1972) 531-537.

Popov, A.I.; Geller, I.KH.; Shemetova, V.K., Memory and threshold switching effects in amorphous selenium, Phys. Stat. Sol. (a) 44 (1977) K71-K73.

Prakash, S.; Asokan, S.; Ghare, D.B., Easily reversible memory switching in Ge-As-Te glasses, J. Phys. D: Appl. Phys. 29 (1996) 2004-2008.

Rahman, S.; Sivarama Sastry, G., Electronic switching in Ge-Bi-Se-Te glasses, Mat. Sci. and Eng. B12 (1992) 219-222.

Ramesh, K.; Asoksan, S.; Sangunni, K.S.; Gopal, E.S.R., Electrical Switching in germanium telluride glasses doped with Cu and Ag, Appl. Phys. A 69 (1999) 421-425.

Rose,M.J.;Hajto,J.;Lecomber,P.G.;Gage,S.M.;Choi,W.K.; Snell,A.J.;Owen,A.E., Amorphous silicon analogue memory devices, J. Non-Cryst. Solids 115 (1989) 168-170.

Rose,M.J.;Snell,A.J.;Lecomber,P.G.;Hajto,J.;Fitzgerald,A. G.;Owen,A.E., Aspects of non-volatility in a -Si:H memory devices, Mat. Res. Soc. Symp. Proc. V 258, 1992, 1075-1080.

Schuocker, D.; Rieder, G., On the reliability of amorphous chalcogenide switching devices, J. Non-Cryst. Solids 29 (1978) 397-407.

Sharma, A.K.; Singh, B., Electrical conductivity measurements of evaporated selenium films in vacuum, Proc. Indian Natn. Sci. Acad. 46, A, (1980) 362-368.

Sharma, P., Structural, electrical and optical properties of silver selenide films, Ind. J. Of pure and applied phys. 35 (1997) 424-427.

Snell, A.J.; Lecomber, P.G.; Hajto, J.; Rose, M.J.; Owen, A.E.; Osborne, I.L., Analogue memory effects in metal/a-Si:H/metal memory devices, J. Non-Cryst. Solids 137-138 (1991) 1257-1262.

Snell, A.J.; Hajto, J.;Rose, M.J.; Osborne, L.S.; Holmes, A.; Owen, A.E.; Gibson, R.A.G., Analogue memory effects in metal/a-Si:H/metal thin film structures, Mat. Res. Soc. Symp. Prov. V 297, 1993, 1017-1021.

Steventon, A.G., Microfilaments in amorphous chalcogenide memory devices, J. Phys. D: Appl. Phys. 8 (1975) L120-L122.

Steventon, A.G., The switching mechanisms in amorphous chalcogenide memory devices, J. Non-Cryst. Solids 21 (1976) 319-329.

Stocker, H.J., Bulk and thin film switching and memory effects in semiconducting chalcogenide glasses, App. Phys. Lett. 15 (1969) 55-57.

Tanaka, K., Ionic and mixed conductions in Ag photodoping process, Mod. Phys. Lett B 4 (1990) 1373-1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387-389.

Thornburg, D.D., Memory switching in a Type 1 amorphous chalcogenide, J. Elect. Mat. 2 (1973) 3-15.

Thornburg, D.D., Memory switching in amorphous arsenic triselenide, J. Non-Cryst. Solids 11 (1972) 113-120.

Thornburg, D.D.; White, R.M., Electric field enhanced phase separation and memory switching in amorphous arsenic triselenide, Journal(??) (1972) 4609-4612.

Tichy, L.; Ticha, H., Remark on the glass-forming ability in GexSe1-x and AsxSe1-x systems, J. Non-Cryst. Solids 261 (2000) 277-281.

Titus, S.S.K.; Chatterjee, R.; Asokan, S., Electrical switching and short-range order in As-Te glasses, Phys. Rev. B 48 (1993) 14650-14652.

Tranchant,S.;Peytavin,S.;Ribes,M.;Flank,A.M.;Dexpert,H.;Lagarde,J.P., Silver chalcogenide glasses Ag-Ge-Se: Ionic conduction and exafs structural investigation, Transport-structure relations in fast ion and mixed conductors Proceedings of the 6th Riso International symposium. Sep. 9-13, 1985.

Tregouet, Y.; Bernede, J.C., Silver movements in Ag2Te thin films: switching and memory effects, Thin Solid Films 57 (1979) 49-54.

Uemura, O.; Kameda, Y.; Kokai, S.; Satow, T., Thermally induced crystallization of amorphous Ge0.4Se0.6, J. Non-Cryst. Solids 117-118 (1990) 219-221.

Uttecht, R.; Stevenson, H.; Sie, C.H.; Griener, J.D.; Raghavan, K.S., Electric field induced filament formation in As-Te-Ge glass, J. Non-Cryst. Solids 2 (1970) 358-370.

Viger, C.; Lefrancois, G.; Fleury, G., Anomalous behaviour of amorphous selenium films, J. Non-Cryst. Solids 33 (1976) 267-272.

Vodenicharov, C.; Parvanov,S.; Petkov,P., Electrode-limited currents in the thin-film M-GeSe-M system, Mat. Chem. And Phys. 21 (1989) 447-454.

Wang, S.-J.; Misium, G.R.; Camp, J.C.; Chen, K.-L.; Tigelaar, H.L., High-performance Metal/silicide antifuse, IEEE electron dev. Lett. 13 (1992)471-472.

Weirauch, D.F., Threshold switching and thermal filaments in amorphous semiconductors, App. Phys. Lett. 16 (1970) 72-73.

West, W.C.; Sieradzki, K.; Kardynal, B.; Kozicki, M.N., Equivalent circuit modeling of the Ag|As0.24S0.36Ag0.40|Ag System prepared by photodissolution of Ag. J. Electrochem. Soc. 145 (1998) 2971-2974.

West, W.C., Electrically erasable non-volatile memory via electrochemical deposition of multifractal aggregates, Ph.D. Dissertation, ASU 1998.

Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>=2.4), J. Non-Cryst. Solids 151 (1992) 149-154.

* cited by examiner

AGGLOMERATION ELIMINATION FOR METAL SPUTTER DEPOSITION OF CHALCOGENIDES

This is a divisional of application Ser. No. 09/809,331, filed on Mar. 15, 2001 U.S. Pat. No. 6,734,455, which is incorporated herein by reference.

FIELD OF THE INVENTION

The present invention relates to integrated circuit fabrication and, more particularly, to fabrication of chalcogenide integrated circuit devices and chalcogenide integrated circuit structures.

BACKGROUND OF THE INVENTION

In the field of integrated circuit memory devices, there is a continuing trend toward memories that have store more information, consume less power, operate faster, take up less space, and cost less to make. While these are often competing interests, memory manufactures strive to make advances in these areas to remain competitive. Thus, the ability to manufacture small memory cells efficiently is crucial in maximizing the performance and cost-efficiency of a memory device.

Popular memories today include dynamic random access memories (DRAMs), static random access memories (SRAMs), read only memories (ROMs), and flash memories. Certain basic characteristics are shared by these memories. For example, these memories typically include one or more memory arrays, where each array has a plurality of memory cells arranged in rows and columns. Other than these basic characteristics, however, these memories possess many different attributes. By way of a general comparison, ROMs and flash memories do not exhibit true random access as do DRAMs and SRAMs. Also, DRAMs and SRAMS are volatile memories. DRAMS require constant power to retain and refresh the contents of the memory. SRAMs require constant power to retain the contents of the memory. ROMs, and flash memories are non-volatile memories. Furthermore, DRAMs typically require less area on a die than the other memories, but DRAMs generally do not exhibit the fastest access times. Thus, as can be appreciated due to the many trade-offs between these different memory configurations, the type of memory used greatly depends upon the requirements of the system in which it is used.

One reason for these differences may be understood by referring to the memory cells used by these various memories. Although the memory cells of these different memories store data in the form of an electrical charge, the memory cells take different forms. The form of a memory cell may dictate many of a memory's characteristics. For instance, the memory cell of a typical dynamic random access memory (DRAM) generally includes a memory element and an access device. The memory element is typically a small capacitor, which stores data as the presence or absence of an electrical charge on the capacitor. The access device, typically referred to as an access transistor, is electrically coupled to the small capacitor and controls the charging and discharging of the capacitor.

DRAMs possess many desirable features, such as large storage capacity, high storage density, and ease of manufacture. However, due to the type of memory cell used, DRAMs also require periodic refreshing, i.e., the capacitors need to be periodically recharged, to maintain the stored information. Although the memory cells of ROMs, and flash memories do not require refreshing, they suffer from disadvantages, such as lower storage densities, larger size, and greater cost to manufacture.

Instead of using memory cells that store information in the form of an electrical charge, memory cells may be manufactured of a material that is capable of storing information. Chalcogenides are a class of materials that may be used to store information in an integrated circuit memory. Chalcogenide material may be electrically stimulated to change states, from an amorphous state to increasingly crystalline states. In the amorphous state, chalcogenide material exhibits a high electrical resistivity. As chalcogenide material progresses into an increasingly crystalline state, its electrical resistivity generally decreases. Because chalcogenide material retains its programmed state even after removal of the electrical stimulus, chalcogenide-based memories are non-volatile. As an added benefit, chalcogenide elements may be repeatedly programmed into two or more states. Thus, chalcogenide-based memories may operate as traditional binary memories or as higher-based memories.

In chalcogenide-based memories, the memory cells are typically formed by disposing chalcogenide material between two electrodes. Examples of chalcogenide-based memories are discussed in U.S. Pat. No. 6,025,220 issued to Sandu; U.S. Pat. No. 6,087,689 issued to Reinberg; U.S. Pat. No. 6,117,720 issued to Harshfield; each assigned to Micron Technology, Inc. and each incorporated herein by reference. As discussed in these patents, U.S. Pat. No. 5,335,219 issued to Ovshinsky et al. provides an explanation of the function and operation of chalcogenide elements and their use in memory cells. U.S. Pat. No. 5,335,219 is also incorporated herein by reference.

A brief description of a conventional chalcogenide memory cell fabrication technique is now provided with reference to FIGS. 1A–1D. A bottom electrode 105 is formed on a substrate (not shown). FIG. 1A shows a chalcogenide, first material layer 107 formed on the bottom electrode 105. A second material layer 109 is formed on the first layer 107. The second layer 109 is then exposed to ultra-violet radiation, which drives the material of second layer 109 into the first layer 107 to create a doped, active chalcogenide material layer 110 (FIG. 1B). A top electrode material is then sputtered on chalcogenide material layer 110 (FIG. 1C). The top electrode material may be a noble metal such as silver. However, the top electrode 115 includes agglomerations or protrusions 120 on the surface thereof (FIG. 1D). FIG. 2 shows a 5 $\mu$m×5 $\mu$m area atomic force microscopy image of the protrusions 120 on the upper surface of top electrode 115 with the chalcogenide material layer 110 being GeSe doped with Ag and the top electrode 115 being Ag. The top electrode is 1000 Å thick. The protrusions 120 have an average height of about 550 Å and create a surface roughness rms of 140 Å. The surface of the electrode also has a terrace area height around the protrusions of 95 Å. It is also noted that the protrusions are visible even for very thin electrode thicknesses such as 100 Å.

In light of the foregoing, there is a need for fabrication of chalcogenide memory devices which reduce agglomeration of sputtered material on the chalcogenide.

SUMMARY OF THE INVENTION

The above mentioned problems with thin film fabrication techniques are addressed by the present invention and will be understood by reading and studying the following specification. The fabrication technique of the present invention includes forming a barrier layer on the layer to be diffused into the chalcogenide layer. Thus, prior to diffusing material into the chalcogenide layer the barrier layer is formed on a stacked layer to be diffused and the chalcogenide layer. In one embodiment according to the teachings of the present invention, the barrier layer is essentially transparent to the irradiation for driving the diffusing material into the chalcogenide layer. In another embodiment, the chalcogenide layer and the barrier layer include the same material.

In one embodiment according to the teachings of the present invention, a memory storage device is formed having a first electrode, a second electrode and a chalcogenide layer intermediate the first and second electrode. The second electrode has a smooth surface. In one embodiment, the smooth surface has an rms surface roughness of less than 140 Å, and, in another embodiment, the rms surface roughness is about 10.8 Å. Another embodiment includes the smooth surface having reduced height protrusions thereon.

Additional embodiments of the invention include methods, structures, deposition devices and systems for forming films on substrates, and machine readable media having fabrication instructions stored thereon as described herein.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims and their equivalents.

DESCRIPTION OF THE EMBODIMENTS

Figure 1D:
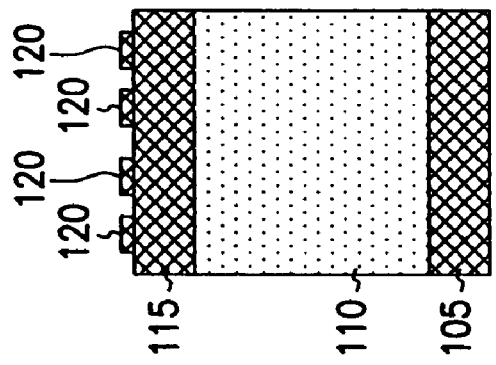
FIGS. 1A to 1D show a conventional fabrication sequence for a chalcogenide memory cell.
Figure 1C:
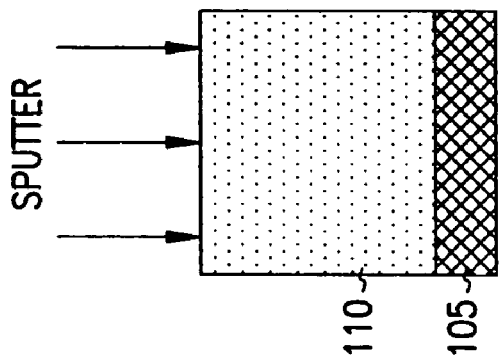
Figure 1B:
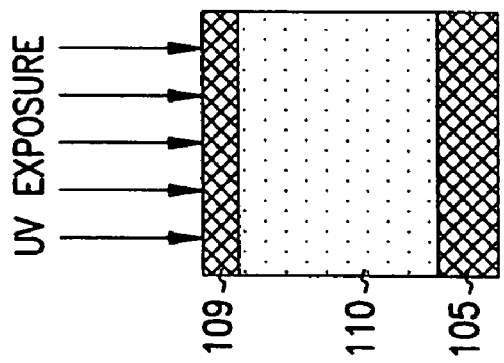
Figure 1A:
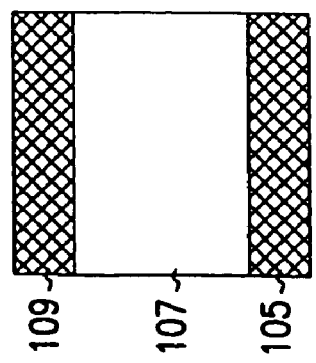

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used herein include any structure having an exposed surface onto which a layer is deposited according to the present invention, for example to form the integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

According to the teachings of the present invention, fabrication of films on substrates, devices and systems for such fabrication, media containing instructions therefor, and integrated circuits produced according to the present invention are described.

Figure 3:
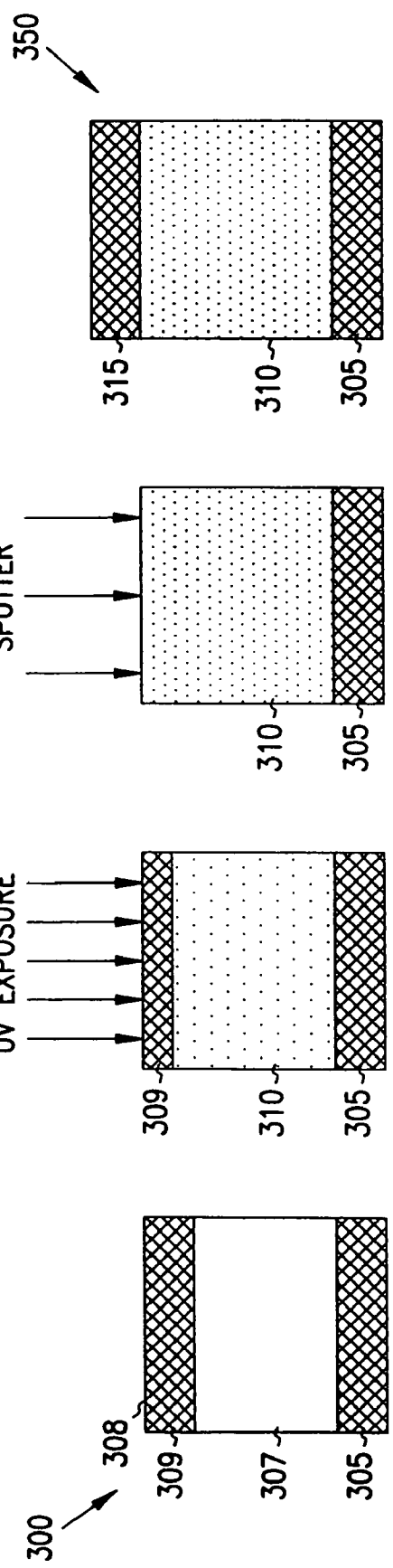
FIGS. 3A to 3D show a fabrication sequence for a chalcogenide memory cell according to the teachings of the present invention.

FIGS. 3A through 3D show structure for a chalcogenide memory cell fabrication process according to the teachings of the present invention. FIG. 3A shows a fundamental stack 300 of layers that undergoes further processing to form a chalcogenide memory cell. Stack 300 includes a bottom electrode 305 formed of a conductive material and on a substrate (not shown). A chalcogenide material layer 307 is formed on the bottom electrode 305. In one use of chalcogenide memory cells, chalcogenide material is electrically stimulated to change states, from an amorphous state to increasingly crystalline states. In the amorphous state, the chalcogenide material exhibits a high electrical resistivity. As chalcogenide material progresses into an increasingly crystalline state, its electrical resistivity generally decreases. Because chalcogenide material retains its programmed state even after removal of the electrical stimulus, chalcogenide-based memories are non-volatile. As an added benefit, chalcogenide elements may be repeatedly programmed into two states. Thus, chalcogenide-based memories operate as traditional binary memories or as higher-based memories. Examples of chalcogenide material include Te, Se, Ge, Sb, Bi, Pb, Sn, As, S, Si, P, and O, and mixtures or alloys thereof. A dopant material layer 309 is formed on layer 307. A thin barrier layer 308 is formed on layer 309. Barrier layer 308 is essentially transparent to activation energy sources which are used to drive the dopant material layer 309 into the chalcogenide material 307 to form an active, doped chalcogenide layer 310.

In another use of chalcogenide memory cells, a phase shift is not the phenomena for storing data. Upon application of a proper electrical signal having polarity dependent magnitudes with suitable duration, the dopant material in the chalcogenide layer forms micro-chains between the electrodes of the memory cell. In one memory state, the micro-chains of silver lower the resistance across the chalcogenide layer. In another memory state, the micro-chains of silver are not formed and/or they do not lower the resistance of the chalcogenide layer. Accordingly, the doped chalcogenide layer has the ability to represent two different memory states.

FIG. 3B shows the fundamental stack 300 undergoing a transformation by exposing the dopant layer 309 to irradiation through the barrier layer 308. The irradiation drives the material of dopant layer into the chalcogenide layer 307 to create doped chalcogenide layer 310. In one embodiment according to the teachings of the present invention, the irradiation is ultraviolet light exposure causing photodissolution of dopant layer 309 into layer 307. The duration, wavelength and intensity of the ultraviolet light are factors which influence the photodissolution of the dopant material into layer 307. These factors are controlled by a reactor and are also dependent on the dopant and chalcogenide materials. One of ordinary skill in the art upon reading this disclosure will understand the suitable ultraviolet light exposure for effecting photodissolution of the dopant layer 309 into layer 307 to achieve the desired chalcogenide properties.

FIG. 3C shows the dopant layer 309 and the barrier layer 308 fully integrated with the chalcogenide layer 307 to form doped chalcogenide layer 310. A top electrode layer 315 is then formed on top of layer 310. In one embodiment according to the teachings of the present invention, the formation of the top electrode layer 315 is performed by sputtering the material of the top electrode layer on layer 310. In one embodiment of the invention the top electrode layer is a metal, more specifically a noble metal such as silver. FIG. 3D shows the formation of the top electrode layer 315. According to the teachings of the present invention, the top electrode 315 does not have the defects, e.g. protrusions 120, formed by conventional fabrication processes as illustrated in FIG. 1D.

In one embodiment according to the teachings of the present invention, the undoped chalcogenide layer 307 is a GeSe layer and the dopant layer 309 is a noble metal. In another embodiment, the noble metal layer is Ag. Thus in this embodiment, the doped chalcogenide layer 310 is Ag—GeSe.

In one embodiment according to the teachings of the present invention, the barrier layer 308 is formed of a material which is the same as the chalcogenide layer 307. Thus, the dopant layer 309 will diffuse into layers 307 and 308 during the irradiation of the material of dopant layer 309 through the essentially transparent barrier layer 308. The barrier layer 308 prevents the dopant material from agglomerating at the surface of the doped chalcogenide layer 310 and attracting the material forming the top electrode, which in turn encourages formation of agglomerations or protrusions in the upper surface of the top electrode. In one embodiment according to the teachings of the present invention, the dopant material is the same as the top electrode material. Thus in one embodiment, the dopant and top electrode are silver.

One embodiment of the present chalcogenide structure 350 (FIG. 3D) is formed from a stack 300 including a metal bottom electrode 305 and a GeSe chalcogenide layer 307 formed on the metal bottom electrode 305, with the GeSe layer 307 having a thickness in the range of about 500 Å to about 1,000 Å. A dopant layer 309 of silver is formed to a thickness in a range of about 100 Å to about 200 Å on the GeSe chalcogenide layer 307. A thin GeSe barrier layer 308 is formed on the silver dopant layer to a thickness in a range of about 20 Å to about 50 Å. The GeSe barrier layer is significantly thinner than either the GeSe chalcogenide layer 307 or the dopant layer 309. The dopant layer 309 is irradiated by ultra-violet light through the barrier layer 308. The barrier layer 308 is transparent to the ultra-violet light. Through the action of photodiffusion, the material of the dopant layer is driven into GeSe chalcogenide layer 307. The dopant layer 309 also diffuses into the barrier layer 308. Accordingly, the doped, active chalcogenide layer 310 of this embodiment includes the chalcogenide layer 307, barrier layer 308 and dopant layer 309. Thereafter, a silver top electrode 315 is formed on layer 310, for example by sputtering, to a thickness in a range of about 1,000 Å to about several thousand Å. In one embodiment, the top electrode has a thickness of about 2,000 Å. A silver doped GeSe chalcogenide memory cell formed according to teachings of the present invention does not have the protrusions or agglomerations which a conventionally formed chalcogenide memory cell.

Figure 2:
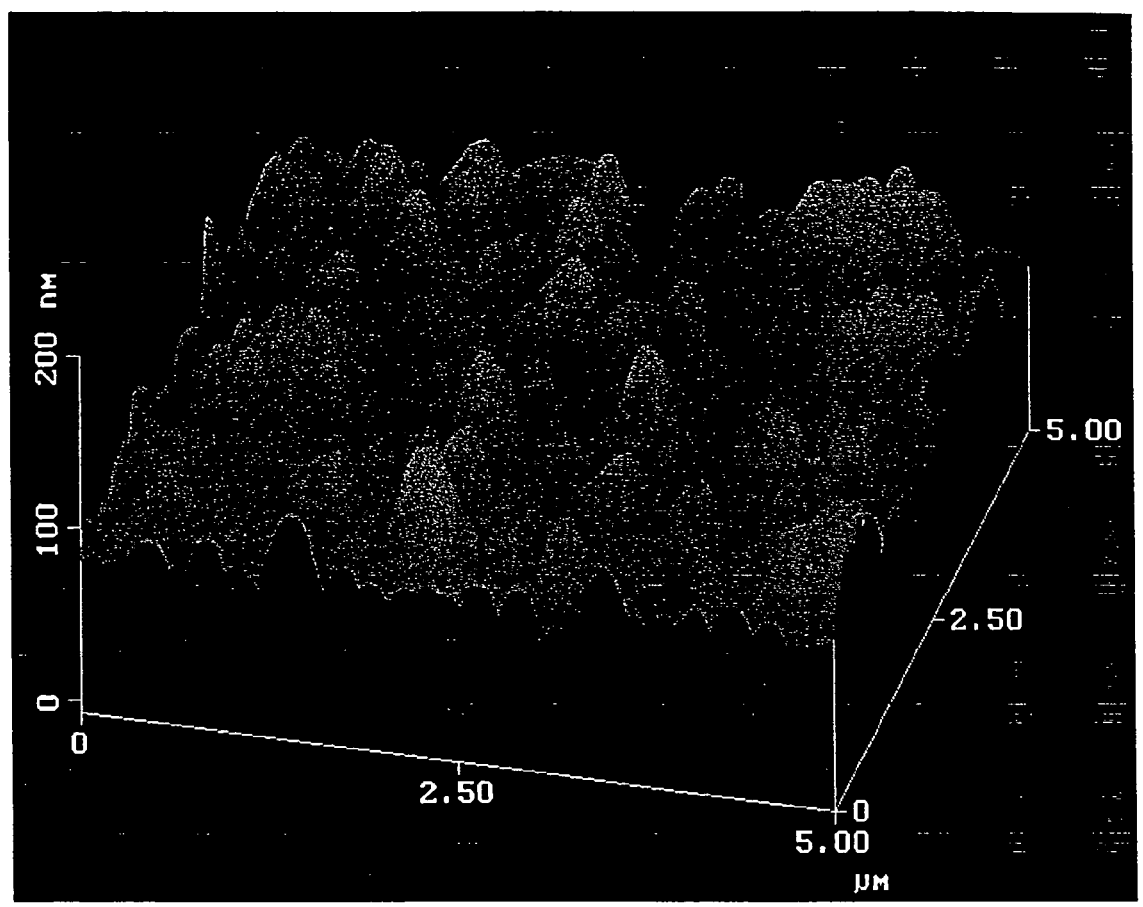
FIG. 2 is an atomic force microscopy image of a conventional chalcogenide memory cell.
Figure 4:
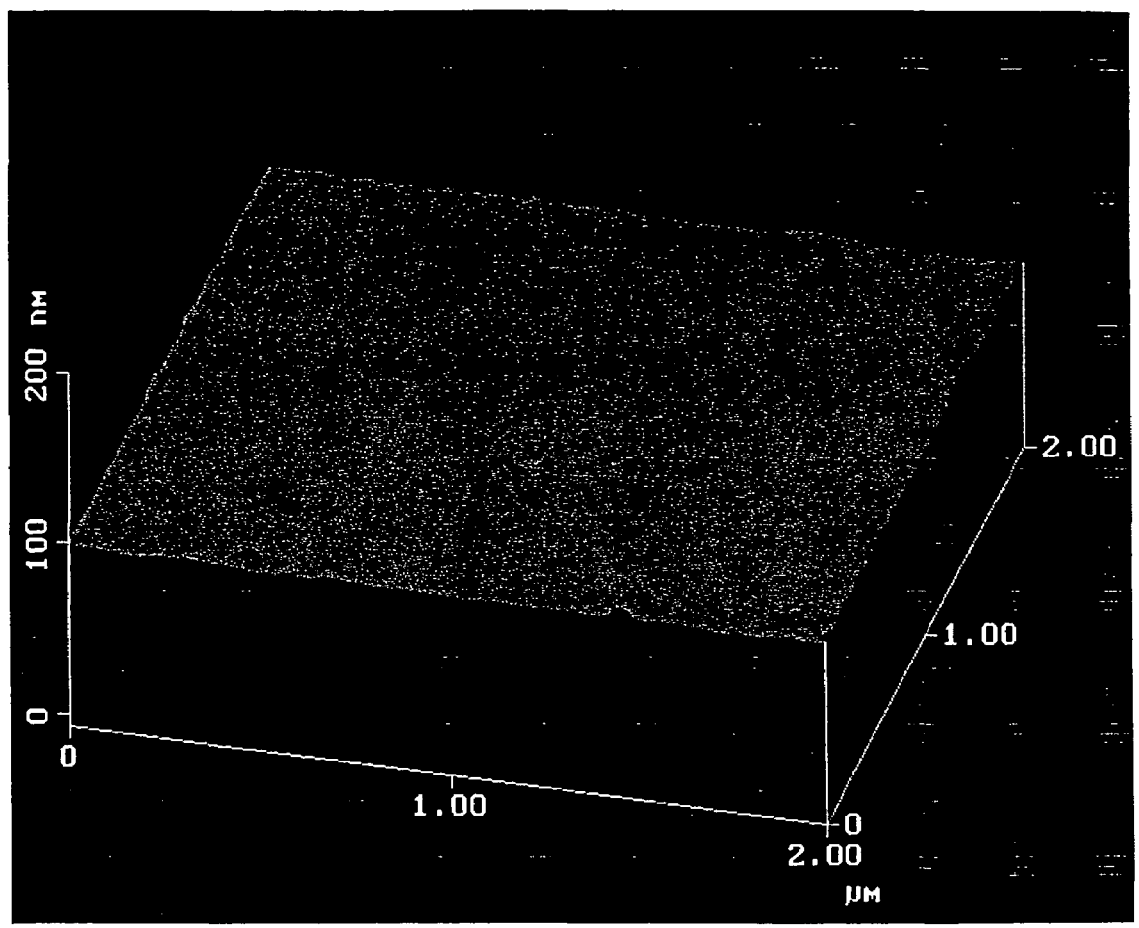
FIG. 4 is an atomic force microscopy image of a sputtered silver layer formed on a silver-germanium-selenium chalcogenide layer according to the teachings of the present invention.

In another embodiment according to the teachings of the present invention, the GeSe chalcogenide layer is formed to a thickness of about 500 Å, the dopant layer is formed of a 150 Å silver layer, and the barrier layer is formed of a 30 Å GeSe layer. The silver top electrode 315 of this embodiment is formed to a thickness of 1000 Å and does not have the tall protrusions of a conventional top electrode 115 (FIG. 2). FIG. 4 shows an image of a chalcogenide structure according to the teachings of the present embodiment. The FIG. 4 shows a 2 $\mu$m×2 $\mu$m area of the silver top electrode 315 of the present embodiment. The maximum height for protrusions on the top electrode surface is about 40 Å. The surface roughness rms is about 10.8 Å. Accordingly, the present embodiment provides a substantial improvement over conventionally formed chalcogenide device which has protrusions with a height of about 550 Å and a surface roughness rms of 140 Å. That is, the present chalcogenide memory cell has insignificant protrusions which are about 7% of the height of the conventionally formed chalcogenide device. Likewise, the surface roughness of the present chalcogenide memory cell is about 7% of the surface roughness of the conventionally formed chalcogenide device.

Therefore, depositing the barrier layer 308 on the dopant layer 309 prior to driving the dopant layer into the chalcogenide layer 307 essentially eliminates or significantly reduces agglomeration, i.e. formation of protrusions, when forming the top electrode on the doped chalcogenide layer 310. Specifically, the method according to the teachings of the present invention reduces top electrode surface roughness and height of protrusions for electrode thicknesses as compared to conventional methods of forming chalcogenide integrated circuit devices which have like electrode thicknesses.

It will be understood that other thicknesses of the barrier layer 308 are within the scope of the present invention. For example, the barrier layer 308 may be thinner or thicker than 30 Å as described in one of the above described embodiments. In one embodiment the barrier layer 308 can be in a range of about 20 Å to about 50 Å. In another embodiment, the barrier layer has a thickness of 30 Å. The barrier layer 308 is limited in its maximum thickness only by the need to keep the barrier layer 308 essentially transparent to the energy source driving the dopant layer 309 into chalcogenide layer 307 to form doped, chalcogenide layer 310.

The use, construction and fundamental operation of reactors for fabricating chalcogenide integrated circuit devices are understood by those of ordinary skill in the art of semiconductor fabrication. The present invention may be practiced on a variety of such reactors without undue experimentation. Furthermore, one of ordinary skill in the art will comprehend the necessary detection, measurement, and control techniques in the art of semiconductor fabrication as well as the more inclusive art of industrial processing for producing films on substrates upon reading the disclosure.

Figure 5:
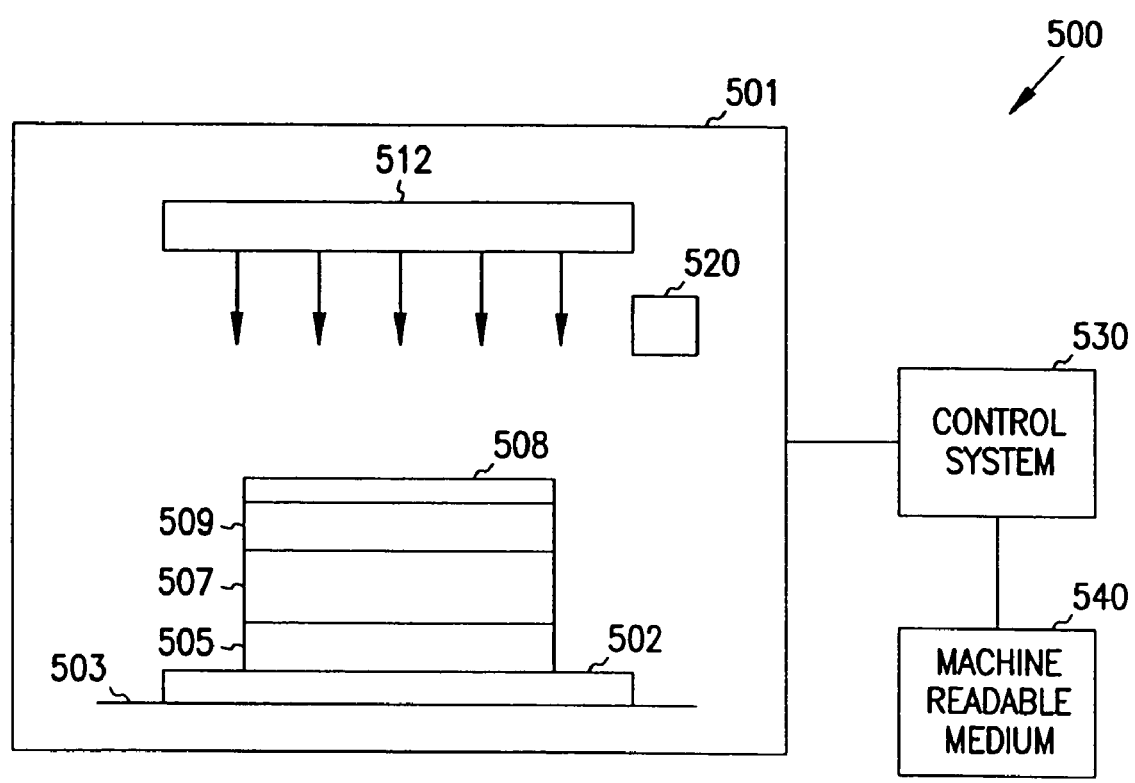
FIG. 5 is a diagram of a system for fabricating a chalcogenide memory cell according to the teachings of the present invention.

FIG. 5 depicts one embodiment of a deposition system 500 suitable for practicing the invention. FIG. 5 is provided for illustrative purposes and the invention is in no way limited to the reactor shown herein. One of ordinary skill in the art will comprehend other suitable systems for practicing the invention described in this application. The embodiment shown in FIG. 5 includes a chamber 501 that is a pressure-sealed compartment for mounting a substrate 502 on susceptor 503. Chamber 501 is typically manufactured from a metal, such as stainless steel, and is designed to contain a low-pressure environment around substrate 502 as well as to contain process gases, exhaust gases, and heat or plasma energy within chamber 501. On the substrate 502 are formed a fundamental chalcogenide structure 503 including, upwardly from the substrate, bottom electrode 505, undoped chalcogenide layer 507, dopant layer 509, and barrier layer 508 as described herein according to the teachings of the present invention. One of ordinary skill in the art will appreciate that these layers may be all formed in the same processing chamber or in a sequence of processing chambers. In the embodiment of FIG. 5, an irradiation source 512 is positioned in the chamber 501 and provides ultraviolet light through barrier layer 508 for driving the dopant layer 509 into the undoped chalcogenide layer 507 and diffusing same into barrier layer 508 according to the teachings of the present invention. It will be recognized that the irradiation source may be positioned outside the chamber 501. The system 500 may also include a source 520 for sputtering a top electrode layer on the doped chalcogenide layer (not shown in FIG. 5). System 500 further includes a control system 530 for controlling the process parameters for forming the layers. The control system 530 may be a stand alone computer, such as a PC or a processor integral with the reactor. In another embodiment, control system 530 maybe a networked computer system or a mainframe computer. The duration and intensity of the ultraviolet light, and the sputtering of the top electrode can all be controlled by the control system 530 as one of ordinary skill in the art will understand upon reading the disclosure. The duration, wavelength and intensity of the ultra-violet light are process parameters which influence the photodissolution of the dopant material 509 into chalcogenide layer 507. Other process parameters that can be controlled by system 530 include temperature of substrate 502 and ambient temperature in chamber 501. The control system 530 may internally store the process parameters and directions for forming the chalcogenide device or it may communicate with a machine readable media 540 on which are stored the process steps an/or the process parameters according to the teachings of the present invention. As shown in FIG. 5, the control system 530 may include, integrally or separately therefrom, the machine readable media 540 which contains instructions for performing the present invention. Media 540 may be an electrical, magnetic, optical, mechanical, etc. storage device that stores instructions that are read by control system 530. Such storage devices include magnetic disks and tape, optical disks, computer memory, etc. Control system 530 may also include a processor (not shown) for issuing instructions to control deposition system 500 based upon instructions read from machine readable media 540.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dies as is well known in the art. A brief description of various embodiments of structures, devices and systems in which the present invention may be incorporated follows. It will be recognized that the following are exemplary and are not exclusive of other structures, devices, and systems in which the memory device according to present invention may be used.

Semiconductor Dies

Figure 6:
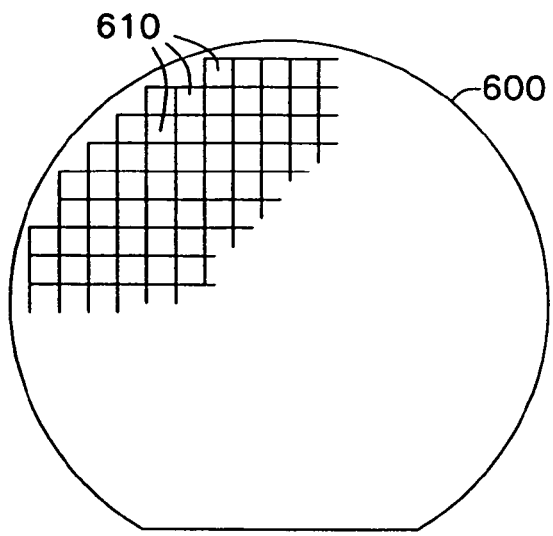
FIG. 6 is a diagram of a wafer including at least one chalcogenide memory cell according to the teachings of the present invention.

With reference to FIG. 6, for one embodiment, a semiconductor die 610 is produced from a wafer 600. A die is an individual pattern, typically rectangular, on a substrate that contains circuitry, or integrated circuit devices, to perform a specific function. At least one of the integrated circuit devices contains a chalcogenide memory device in accordance with the present description. A semiconductor wafer will typically contain a repeated pattern of such dies containing the same functionality. Die 610 may contain additional circuitry for the memory device as discussed herein. Die 610 may further contain additional circuitry to extend to such complex devices as a monolithic processor with multiple functionalities. Die 610 is typically packaged in a protective casing (not shown) with leads extending therefrom (not shown) providing access to the circuitry of the die for unilateral or bilateral communication and control.

Circuit Modules

Figure 7:
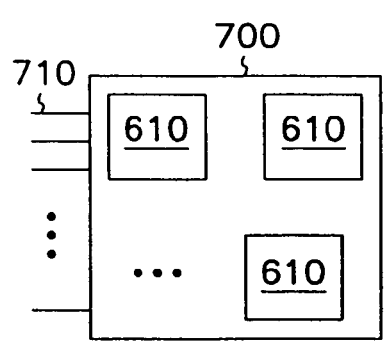
FIG. 7 is a block diagram of a circuit module including at least one chalcogenide memory cell according to the teachings of the present invention.

As shown in FIG. 7, two or more dies 610 may be combined, with or without protective casing, into a circuit module 700 to enhance or extend the functionality of an individual die 610. Circuit module 700 may be a combination of dies 610 representing a variety of functions, or a combination of dies 610 containing the same functionality. One or more dies 610 of circuit module 700 contain at least one chalcogenide memory device as described herein.

Some examples of a circuit module include memory modules, device drivers, power modules, communication modems, processor modules and application-specific modules, and may include multilayer, multichip modules. Circuit module 700 may be a subcomponent of a variety of electronic systems, such as a clock, a television, a cell phone, a personal computer, an automobile, an industrial control system, an aircraft and others. Circuit module 700 will have a variety of leads 710 extending therefrom and coupled to the dies 610 providing unilateral or bilateral communication and control.

Figure 8:
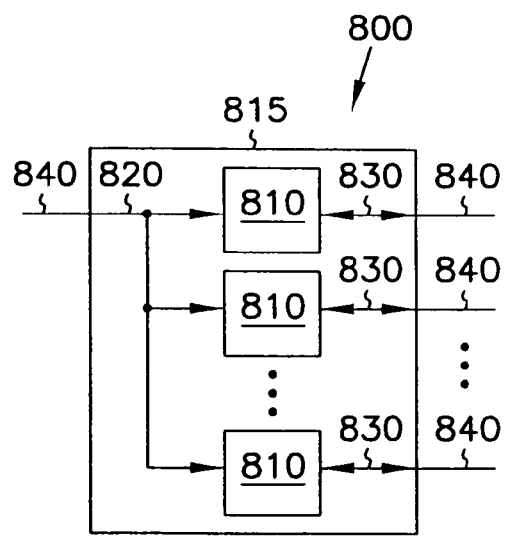
FIG. 8 is a block diagram of a memory module including at least one chalcogenide memory cell according to the teachings of the present invention.

FIG. 8 shows one embodiment of a circuit module as memory module 800. Memory module 800 contains multiple memory devices 810 contained on support 815, the number generally depending upon the desired bus width and the desire for parity. Memory devices 810 include at least one chalcogenide memory device as described herein. Memory module 800 accepts a command signal from an external controller (not shown) on a command link 820 which provides for data commands. Memory module 800 further includes a number of data links 830 for input and output of data. The command link 820 and data links 830 are connected to leads 840 extending from the support 815.

Leads 840 are shown for conceptual purposes and are not limited to the positions shown in FIG. 8.

Electronic Systems

Figure 9:
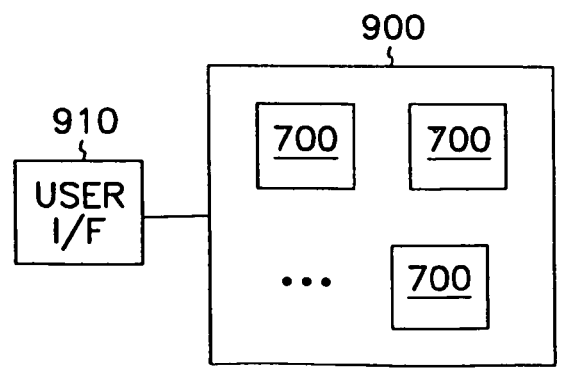
FIG. 9 is a block diagram of an electronic system including at least one chalcogenide memory cell according to the teachings of the present invention.

FIG. 9 shows one embodiment of an electronic system 900 containing one or more circuit modules 700, at least one of which includes a chalcogenide memory device as described herein. Electronic system 900 generally contains a user interface 910. User interface 910 provides a user of the electronic system 900 with some form of control or observation of the results of the electronic system 900. Some examples of user interface 910 include the keyboard, pointing device, monitor or printer of a personal computer; the tuning dial, display or speakers of a radio; the ignition switch, gauges or gas pedal of an automobile; and the card reader, keypad, display or currency dispenser of an automated teller machine. User interface 910 may further describe access ports provided to electronic system 900. Access ports are used to connect an electronic system to the more tangible user interface components previously exemplified. One or more of the circuit modules 700 may be a processor providing some form of manipulation, control or direction of inputs from or outputs to user interface 910, or of other information either preprogrammed into, or otherwise provided to, electronic system 900. As will be apparent from the lists of examples previously given, electronic system 900 will often be associated with certain mechanical components (not shown) in addition to circuit modules 700 and user interface 910. It will be appreciated that the one or more circuit modules 700 in electronic system 900 can be replaced by a single integrated circuit. Furthermore, electronic system 900 may be a subcomponent of a larger electronic system.

Figure 10:
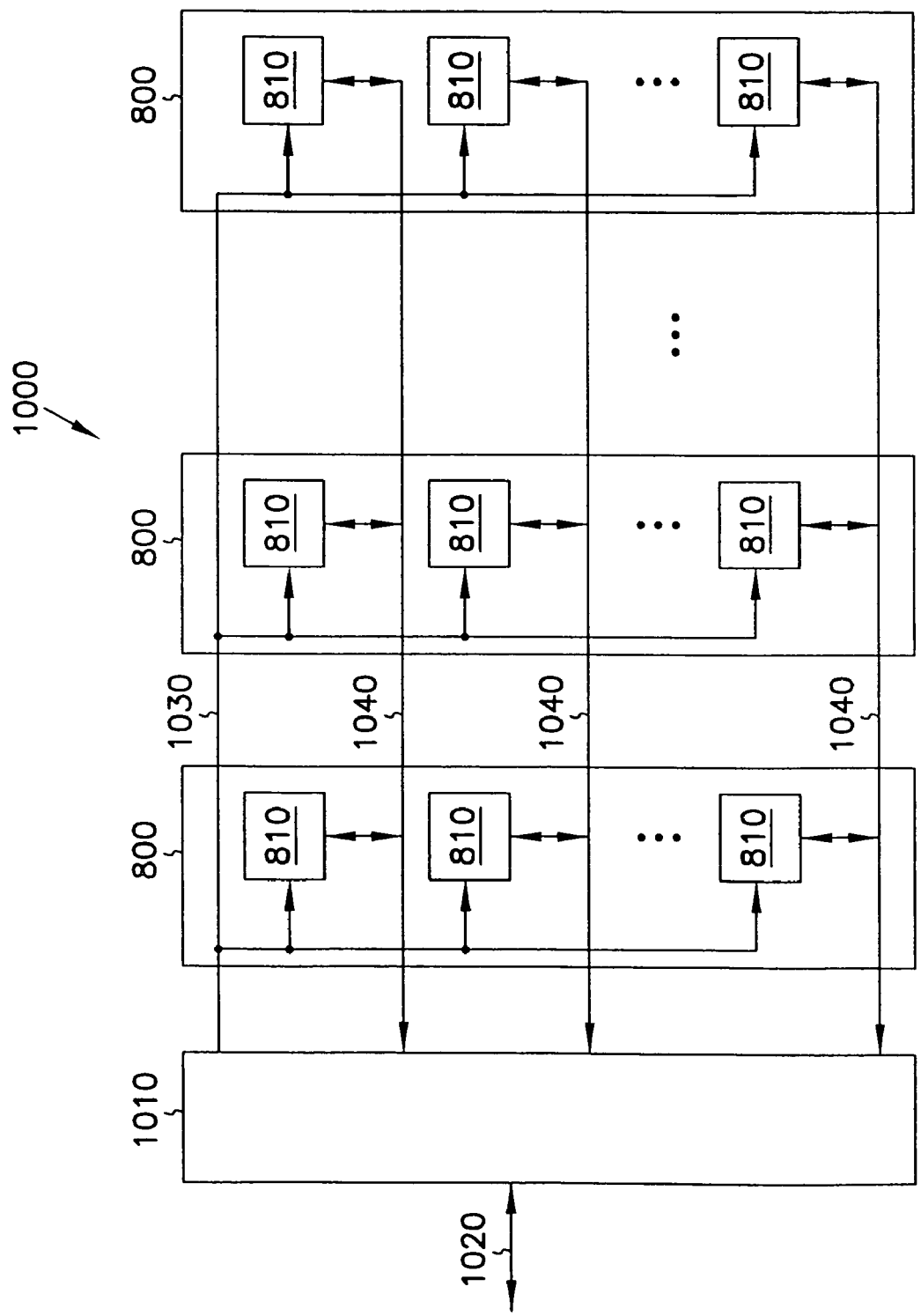
FIG. 10 is a block diagram of a memory system including at least one chalcogenide memory cell according to the teachings of the present invention.

FIG. 10 shows one embodiment of an electronic system as memory system 1000. Memory system 1000 contains one or more memory modules 800 and a memory controller 1010. At least one of the memory modules includes a chalcogenide memory device as described herein. Memory controller 1010 provides and controls a bidirectional interface between memory system 1000 and an external system bus 1020. Memory system 1000 accepts a command signal from the external bus 1020 and relays it to the one or more memory modules 800 on a command link 1030. Memory system 1000 provides for data input and data output between the one or more memory modules 800 and external system bus 1020 on data links 1040.

Figure 11:
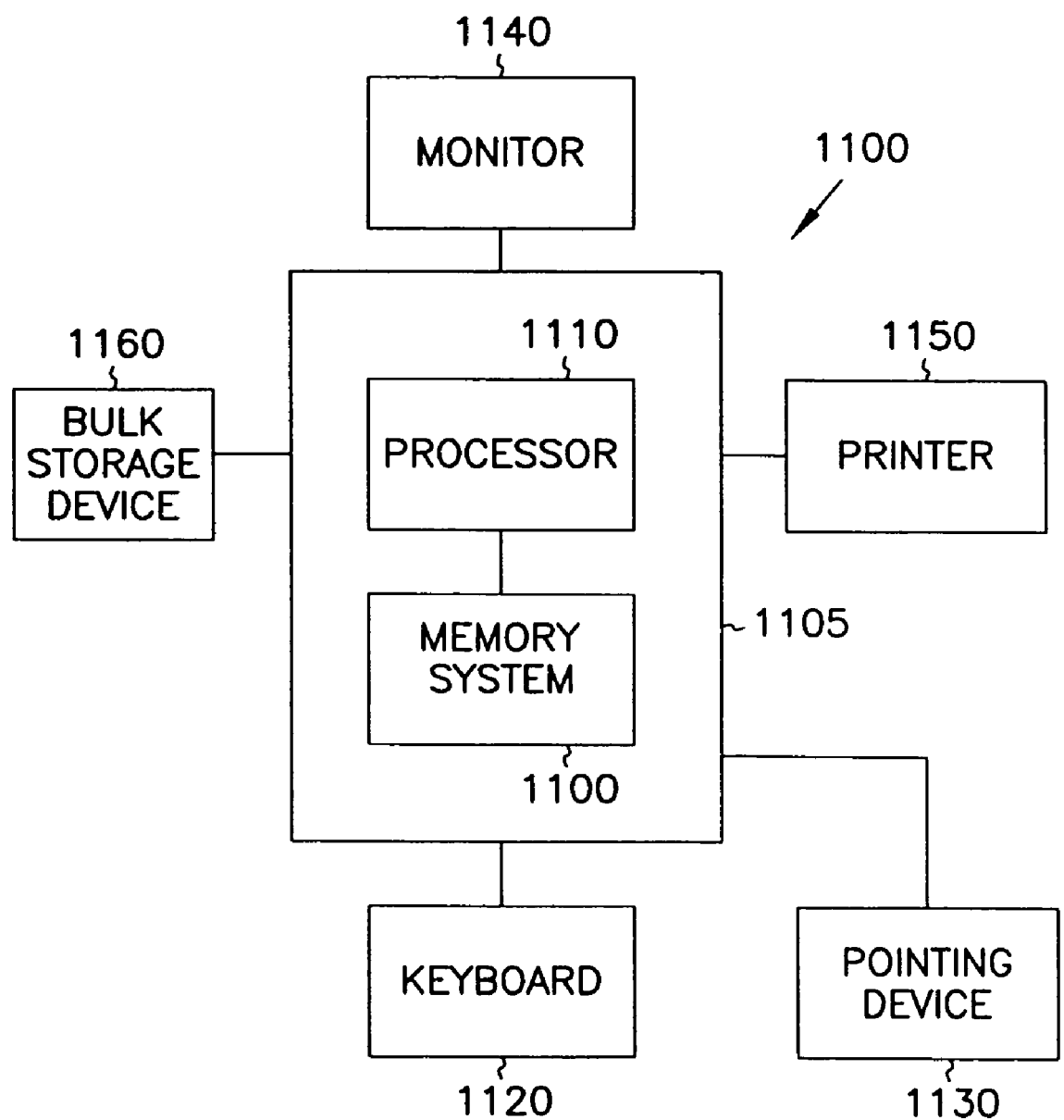
FIG. 11 is a block diagram of a computer system including at least one chalcogenide memory cell according to the teachings of the present invention.

FIG. 11 shows a further embodiment of an electronic system as a computer system 1100. Computer system 1100 contains a processor 1110 and a memory system 1000 housed in a computer unit 1105. Computer system 1100 is but one example of an electronic system containing another electronic system, i.e., memory system 1000, as a subcomponent. The memory system includes at least one chalcogenide memory device as described herein. Computer system 1100 optionally contains user interface components. Depicted in FIG. 11 are a keyboard 1120, a pointing device 1130, a monitor 1140, a printer 1150 and a bulk storage device 1160. It will be appreciated that other components are often associated with computer system 1100 such as modems, device driver cards, additional storage devices, etc. It will further be appreciated that the processor 1110 and memory system 1000 of computer system 1100 can be incorporated on a single integrated circuit. Such single package processing units reduce the communication time between the processor and the memory circuit.

CONCLUSION

Thus, the present invention provides improved structures of and methods for fabrication of chalcogenide integrated circuit devices according to the teachings of the present invention. The fabrication of the chalcogenide device includes formation of a barrier layer on the dopant/chalcogenide stack prior to driving the dopant into the chalcogenide layer. The resulting doped chalcogenide layer provides a superior base on which a top electrode is formed. The top electrode accordingly has fewer protrusions and reduced surface roughness compared to conventional fabrication techniques.

While the above description specifically references certain materials for forming the chalcogenide memory device, it will be understood that the present invention is not limited to these examples. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. An integrated circuit device prepared by a process comprising:
    forming a first layer containing a chalcogenide material;
    forming a second layer over the first layer wherein the second layer is formed of at least one non-chalcogeinde chemical element;
    forming a third layer over the second layer, wherein the third layer comprises a chalcogenide material; and
    diffusing the second layer into the first layer to create an integral layer including materials from the first and second layers, wherein the material from the second layer comprises at least the non-chalcogenide chemical element.

2. The integrated circuit according to claim 1 wherein the third layer comprises germanium-selenide.

3. An integrated circuit device prepared by a process comprising:
    forming a first layer containing a chalcogenide material;
    forming a second layer over the first layer wherein the second layer is formed of at least one non-chalcogenide chemical element;
    forming a third layer to a thickness in a range of about 20 Å to about 50 Å over the second layer; and
    diffusing the second layer into the first layer to create an integral layer including materials from the first and second layers, wherein the material from the second layer comprises at least the non-chalcogenide chemical element.

4. The integrated circuit according to claim 3 wherein the first layer comprises germanium-selenide.

5. A chalcogenide integrated circuit device prepared by a process comprising:
    forming a chalcogenide layer;
    forming a metal layer to a thickness in a range of about 100 Å to about 200 Å over the chalcogenide layer;
    forming a barrier layer over the metal layer; and
    irradiating the metal layer through the barrier layer to diffuse the metal layer into the chalcogenide layer to create a metal doped chalcogenide layer.

6. A chalcogenide integrated circuit device prepared by a process comprising:
    forming a chalcogenide layer;
    forming a metal layer over the chalcogenide layer;
    forming a barrier layer over the metal layer, wherein the barrier layer comprises a chalcogenide material; and irradiating the metal layer through the barrier layer to diffuse the metal layer into the chalcogenide layer to create a metal doped chalcogenide layer.

7. The chalcogenide integrated circuit according to claim 6 wherein the barrier layer comprises germanium-selenide.

8. The chalcogenide integrated circuit according to claim 6 wherein the barrier layer is formed of a material which is the same as the chalcogenide layer.

9. A chalcogenide integrated circuit device prepared by a process comprising:
   forming a chalcogenide layer;
   forming a metal layer over the chalcogenide layer;
   forming a barrier layer to a thickness in a range of about 20 Å to about 50 Å over the metal layer; and
   irradiating the metal layer through the barrier layer to diffuse the metal layer into the chalcogenide layer to create a metal doped chalcogenide layer.

10. The chalcogenide integrated circuit according to claim 9 wherein the barrier layer has a thickness of about 30 Å.

11. The chalcogenide integrated circuit according to claim 9 wherein the chalcogenide layer has a thickness in a range of about 500 Å to about 1000 Å.

* * * * *

UNITED STATES PATENT AND TRADEMARK OFFICE
CERTIFICATE OF CORRECTION

PATENT NO. : 6,974,965 B2  
DATED : December 13, 2005  
INVENTOR(S) : Jiutao Li

It is certified that error appears in the above-identified patent and that said Letters Patent is hereby corrected as shown below:

<u>Title page,</u>  
Item [56], References Cited, U.S. PATENT DOCUMENTS,  
add -- 6,473,332        4/2001           Ignatiev et al. --.

<u>Column 7,</u>  
Line 45, "maybe" should read -- may be --.

Signed and Sealed this

Fourth Day of April, 2006

JON W. DUDAS  
*Director of the United States Patent and Trademark Office*